(12) United States Patent
Kiyokawa et al.

(10) Patent No.: US 11,579,187 B1
(45) Date of Patent: Feb. 14, 2023

(54) TEST CARRIER AND ELECTRONIC COMPONENT TESTING APPARATUS

(71) Applicant: ADVANTEST Corporation, Tokyo (JP)

(72) Inventors: Toshiyuki Kiyokawa, Tokyo (JP); Yuya Yamada, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/681,039

(22) Filed: Feb. 25, 2022

(30) Foreign Application Priority Data

Jul. 21, 2021 (JP) .............................. JP2021-120855

(51) Int. Cl.
*G01R 31/28* (2006.01)

(52) U.S. Cl.
CPC ................................ *G01R 31/2877* (2013.01)

(58) Field of Classification Search
CPC .................................................. G01R 31/2877
See application file for complete search history.

(56) References Cited

U.S. PATENT DOCUMENTS

| | | | | |
|---|---|---|---|---|
| 5,220,956 A * | 6/1993 | Noble, Jr | ............. | G01R 1/0458 361/691 |
| 7,100,389 B1 * | 9/2006 | Wayburn | ............... | F25D 19/006 324/750.08 |
| 7,830,164 B2 | 11/2010 | Earle et al. | | |
| 2004/0077200 A1 | 4/2004 | Ishikawa et al. | | |
| 2005/0202716 A1 | 9/2005 | Saito | | |
| 2006/0270265 A1 | 11/2006 | Saito | | |
| 2009/0183908 A1 | 7/2009 | Kazama et al. | | |
| 2019/0109653 A1 * | 4/2019 | Tankielun | ............ | H04B 17/103 |
| 2019/0302178 A1 * | 10/2019 | Saito | .................. | G01R 31/2874 |
| 2019/0324056 A1 | 10/2019 | Akers et al. | | |
| 2019/0346482 A1 * | 11/2019 | Kiyokawa | ............ | G01R 1/0433 |
| 2020/0371158 A1 | 11/2020 | Kato et al. | | |
| 2022/0011340 A1 | 1/2022 | Kiyokawa et al. | | |
| 2022/0011341 A1 | 1/2022 | Kiyokawa et al. | | |
| 2022/0011342 A1 | 1/2022 | Kiyokawa et al. | | |
| 2022/0011343 A1 | 1/2022 | Kiyokawa et al. | | |

FOREIGN PATENT DOCUMENTS

| | | |
|---|---|---|
| JP | H11-337614 A | 12/1999 |
| JP | 2000-162268 A | 6/2000 |
| JP | 2000-249739 A | 9/2000 |
| JP | 2001-033520 A | 2/2001 |
| JP | 2002-236140 A | 8/2002 |
| JP | 2004-347329 A | 12/2004 |
| JP | 2007-121247 A | 5/2007 |
| JP | 2013-008499 A | 1/2013 |
| JP | 2017-003413 A | 1/2017 |

(Continued)

OTHER PUBLICATIONS

Notice of Reasons for Refusal issued in Japanese Application No. 2021-120855 dated Apr. 19, 2022 (8 pages).

(Continued)

*Primary Examiner* — Dominic E Hawkins
(74) *Attorney, Agent, or Firm* — Osha Bergman Watanabe & Burton LLP

(57) ABSTRACT

A test carrier that accommodates a DUT and includes a first flow passage through which fluid supplied from an outside of the test carrier flows.

16 Claims, 14 Drawing Sheets

(56) References Cited

FOREIGN PATENT DOCUMENTS

| | | |
|---|---|---|
| JP | 2019-197012 A | 11/2019 |
| JP | 2020-190520 A | 11/2020 |
| JP | 2021-519928 A | 8/2021 |
| KR | 100290033 B1 | 7/2001 |
| KR | 20130099827 A | 9/2013 |
| WO | 03/075024 A1 | 9/2003 |
| WO | 2009/069189 A1 | 6/2009 |

OTHER PUBLICATIONS

Notice of Reasons for Refusal issued in corresponding Japanese Application No. 2021-120855 dated Jul. 12, 2022 (7 pages).
Office Action issued in corresponding Korean Patent Application No. 10-2022-0022908 dated Nov. 11, 2022 (11 pages).

* cited by examiner

TEST CARRIER AND ELECTRONIC COMPONENT TESTING APPARATUS

CROSS-REFERENCE TO RELATED APPLICATIONS

The present application claims priority from Japanese Patent Application No. 2021-120855 filed on Jul. 21, 2021, the contents of which are incorporated herein by reference in their entirety.

BACKGROUND

Technical Field

The present invention relates to a test carrier carried in a state of accommodating an electronic component to be tested (hereinafter simply referred to as a "device under test" (DUT) such as a semiconductor integrated circuit device at the time of testing the DUT, and an electronic component testing apparatus.

Description of Related Art

An electronic component testing apparatus has a mechanism for heating and cooling the IC (Integrated Circuit) under test and performs a temperature load test of the IC under test (for example, see Patent Document 1).

PATENT DOCUMENT

Patent Document 1: JP 2000-162268 A

The above-mentioned electronic component testing apparatus directly blow hot air or cold air to the IC under test to adjust temperature of the IC under test. When the above-mentioned testing apparatus performs the test of the DUT in a state of being accommodated in the test carrier, it is impossible to directly blow cold air to the DUT. That is, the test carrier behaves as thermal resistance. For this reason, the DUT may be damaged due to insufficient cooling of the DUT.

SUMMARY

One or more embodiments of the present invention provide a test carrier and an electronic component testing apparatus capable of improving the efficiency of adjustment of the DUT temperature.

[1] A test carrier according to one or more embodiments of the present invention is carried in a state of accommodating a device under test (DUT). The test carrier comprises a first flow passage through which fluid supplied from an outside of the test carrier flows.

[2] In the above embodiments, the first flow passage may comprise: a flow hole formed in the test carrier; a first connection hole communicated with a first end of the flow hole; a second connection hole communicated with a second end of the flow hole. Fluid is supplied to the flow hole from the first connection hole and exhausted from the second connection hole.

[3] In the above embodiments, the test carrier may further comprise: a carrier body holding the DUT; and a lid member (i.e., a lid) covering the DUT and detachably attaching to the carrier body. The flow hole may be formed in the lid member. The first connection hole and the second connection hole may be formed on the lid member.

[4] In the above embodiments, fluid may be supplied to the first flow passage from a pusher, and the pusher may press the test carrier to a socket of a test head.

[5] In the above embodiments, the first connection hole and the second connection hole may be disposed on the test carrier to face the pusher.

[6] In the above embodiments, the carrier body may comprise: contactors provided to correspond to terminals of the DUT; external terminals electrically connected to contactors; and a main body holding contactors and external terminals.

[7] In the above embodiments, the lid member may comprise a contact surface contacting the DUT. The DUT may be sandwiched between the contact surface and contactors.

[8] In the above embodiments, the test carrier may further comprise: a carrier body holding the DUT; and a lid member covering the DUT and detachably attaching to the carrier body. The flow hole may be formed in the carrier body, and the first connection hole and the second connection hole may be formed on the carrier body.

[9] In the above embodiments, a test head of the electronic component testing apparatus for testing the DUT may supply fluid to the first flow passage.

[10] In the above embodiments, the first connection hole and the second connection hole may be disposed at a position facing the test head in the test carrier.

[11] In the above embodiments, the first connection hole and the second connection hole may be disposed on the test carrier to face a socket of the test head.

[12] In the above embodiments, the carrier body may comprise: contactors provided to correspond to terminals of the DUT; external terminals electrically connected to contactors; and a main body holding contactors and external terminals.

[13] In the above embodiments, the lid member may comprise a contact surface. The DUT may be sandwiched between the contact surface and contactors.

[14] In the above embodiments, the test carrier may comprise the first connecting holes.

[15] In the above embodiments, the test carrier may include the second connecting holes.

[16] In the above embodiments, the test carrier may comprise the flow holes.

[17] An electronic component testing apparatus according to one or more embodiments of the present invention tests a DUT. The electronic component testing apparatus comprises: a test head comprising a socket; and a pusher pressing the above-mentioned test carrier to the socket. The pusher supplies fluid to the first flow passage.

[18] In the above embodiments, the pusher may comprise: a third connection hole communicated with the first flow passage with the pusher contacting the test carrier; a second flow passage communicated with the third connection hole. Fluid may be supplied to the first flow passage through the second flow passage with the pusher pressing the test carrier to the socket.

[19] In the above embodiments, the pusher may comprise a fourth connection hole detachably connected to the test head and receiving fluid from the test head. The fourth connection hole may be connected to the second flow passage. Fluid may be supplied to the first flow passage through the second flow passage from the test head with the pusher pressing the test carrier to the socket.

[20] In the above embodiments, the pusher may comprise a first connection pin capable of fitting into a first fitting hole. The first fitting hole may be formed on a socket guide of the test head. A part of the second flow passage may be formed in the first connection pin. The third connection hole may be formed on the first connection pin.

[21] In the above embodiments, the pusher may comprise: a fifth connection hole communicated with the first flow passage with the pusher contacting to the carrier; and a third flow passage communicated with the fifth connection hole. Fluid supplied to the first flow passage flows into the third flow passage with the pusher pressing the test carrier to the socket.

[22] In the above embodiments, the pusher may exhaust fluid supplied to the first flow passage to the outside of the pusher from the third flow passage.

[23] In the above embodiments, the pusher may further comprise a sixth connection hole detachably attaching the test head and exhausting fluid to the test head. The third flow passage may connect the fifth connection hole and the sixth connection hole. Fluid supplied to the first flow passage may be exhausted to the test head through the third flow passage.

[24] In the above embodiments, the pusher may comprise a second connection pin capable of fitting into a second fitting hole. The second fitting hole may be formed on a socket guide of the test head. A part of the third flow passage may be formed in the second connection pin. The sixth connection hole may be formed on the second connection pin.

[25] An electronic component testing apparatus for testing the DUT according to one or more embodiments of the present invention, comprises: a test head comprising a socket; and a pusher pressing the above-mentioned test carrier to the socket. The test head supplies fluid to the first flow passage.

[26] In the above embodiments, the test head may supply fluid to the flow hole through the first connection hole. Fluid may be exhausted from the second connection hole to the test head.

The test carrier according to one or more embodiments of the present invention includes a first flow passage through which a fluid supplied from the outside flows. Since fluid flows in the vicinity of the DUT accommodated in the test carrier, thermal resistance is reduced. Therefore, it is possible to improve the efficiency of adjustment of the DUT temperature.

DETAILED DESCRIPTION

Hereinafter, embodiments of the present invention will be described with reference to the drawings.

Figure 1:
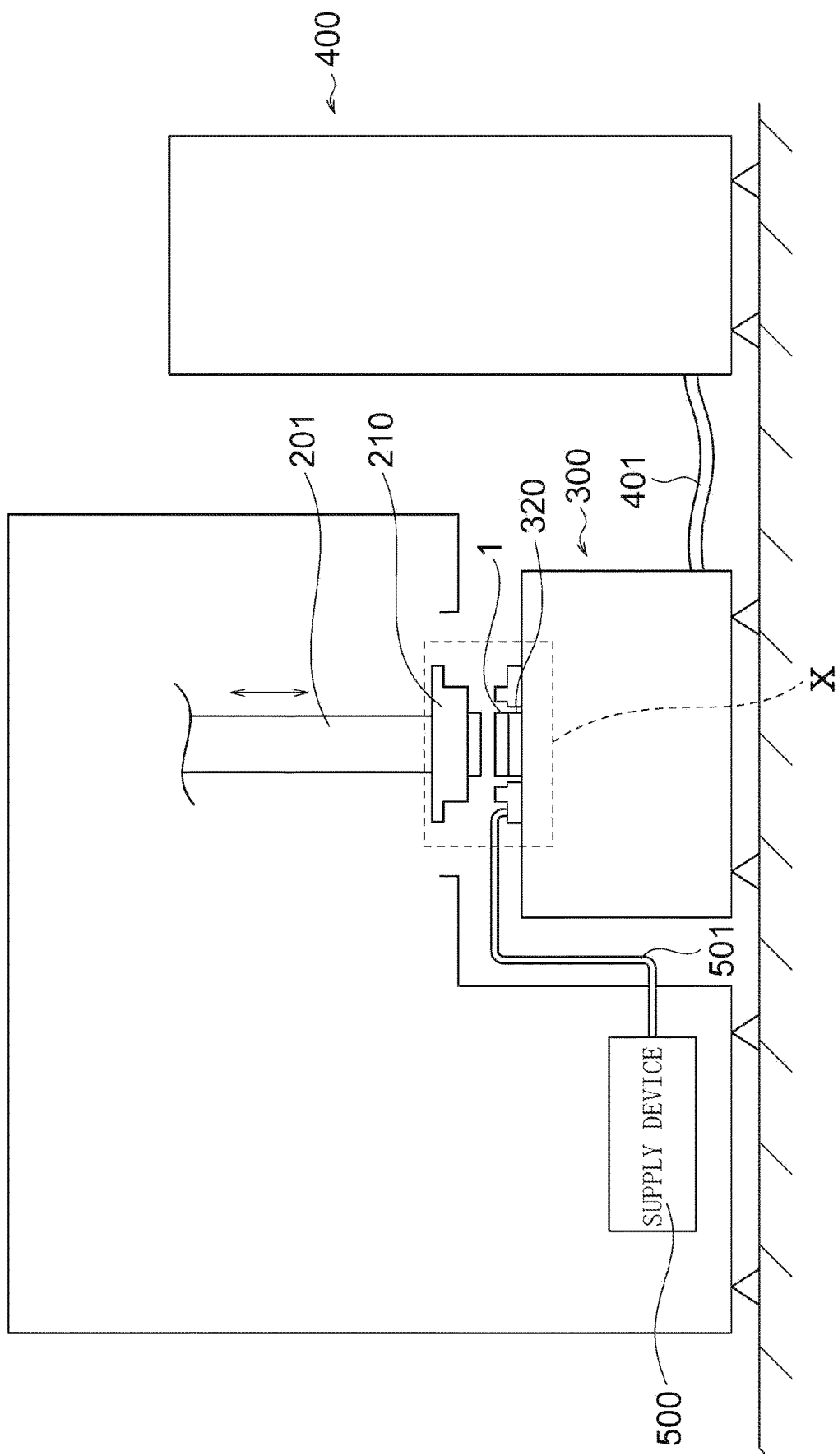
FIG. 1 is a schematic cross-sectional view showing an entire configuration of an electronic component testing apparatus in one or more embodiments of the present invention.

FIG. 1 is a schematic cross-sectional view showing the overall configuration of the electronic component testing apparatus in one or more embodiments.

An electronic component testing apparatus 100 in one or more embodiments is an apparatus for testing electrical properties of a DUT 90. The electronic component testing apparatus 100 includes a handler 200 for pressing the DUT to the socket 320. The handler 200 includes a positioning mechanism for mechanically positioning the DUT with respect to the socket 320. The handler 200 doesn't include a high-precision positioning mechanism using image processing for the so-called fine pitch DUT. On the other hand, the DUT 90 in one or more embodiments is a die produced by dicing a semiconductor wafer. The DUT 90 has pads 91 with fine pitch. Therefore, when the electronic component testing apparatus 100 performs the test of the DUT 90, the test carrier 1 is used.

In one or more embodiments, when the semiconductor wafer is diced to form the DUT 90, first, the DUT 90 is accommodated in the test carrier 1 using a carrier assembling apparatus (not illustrated). Then, the test carrier 1 accommodating the DUT 90 is carried to a test tray (not illustrated) for carrying the device. The test carrier 1 mounted on the test tray is pressed to the socket 320 of the test head 300 of the electronic component testing apparatus 100 to electrically connect the DUT 90 and the socket 320 via the test carrier 1. Then, the test of the DUT 90 is executed. When this test is completed, the test carrier 1 is taken out from the test tray, the test carrier 1 is disassembled, and the DUT 90 is taken out. The test carrier 1 from which the DUT 90 is taken out is reused for testing of another DUT 90.

As this test tray, a test tray used for existing packaged devices can be used. Such test tray includes a frame-shaped frame, inserts 600 held in the frame (described later). The inserts 600 of the test tray hold the carrier 1. The outer shape of the insert 600 is made to match the outer shape of the existing device, it is possible to load and carry the test carrier 1 to the existing test tray by using the insert 600. As the test tray and the insert 600, for example, known test tray and insert described in WO 2003/075024 and WO 2009/069189 and the like can be used.

Next, the configuration of the test carrier 1 in one or more embodiments will be described below with FIGS. 2 to 7.

Figure 2:
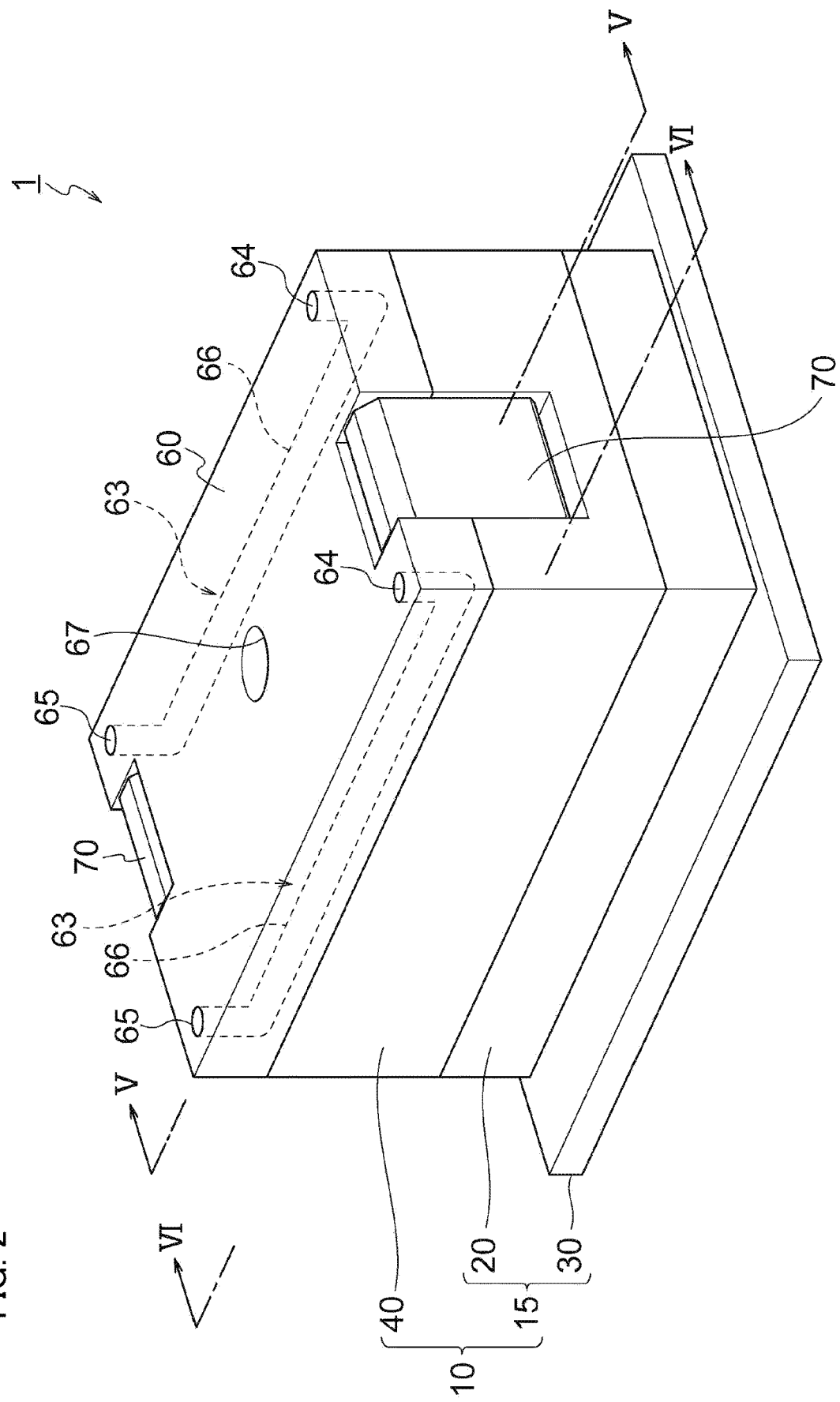
FIG. 2 is a perspective view of a test carrier in one or more embodiments of the present invention from above.
Figure 3:
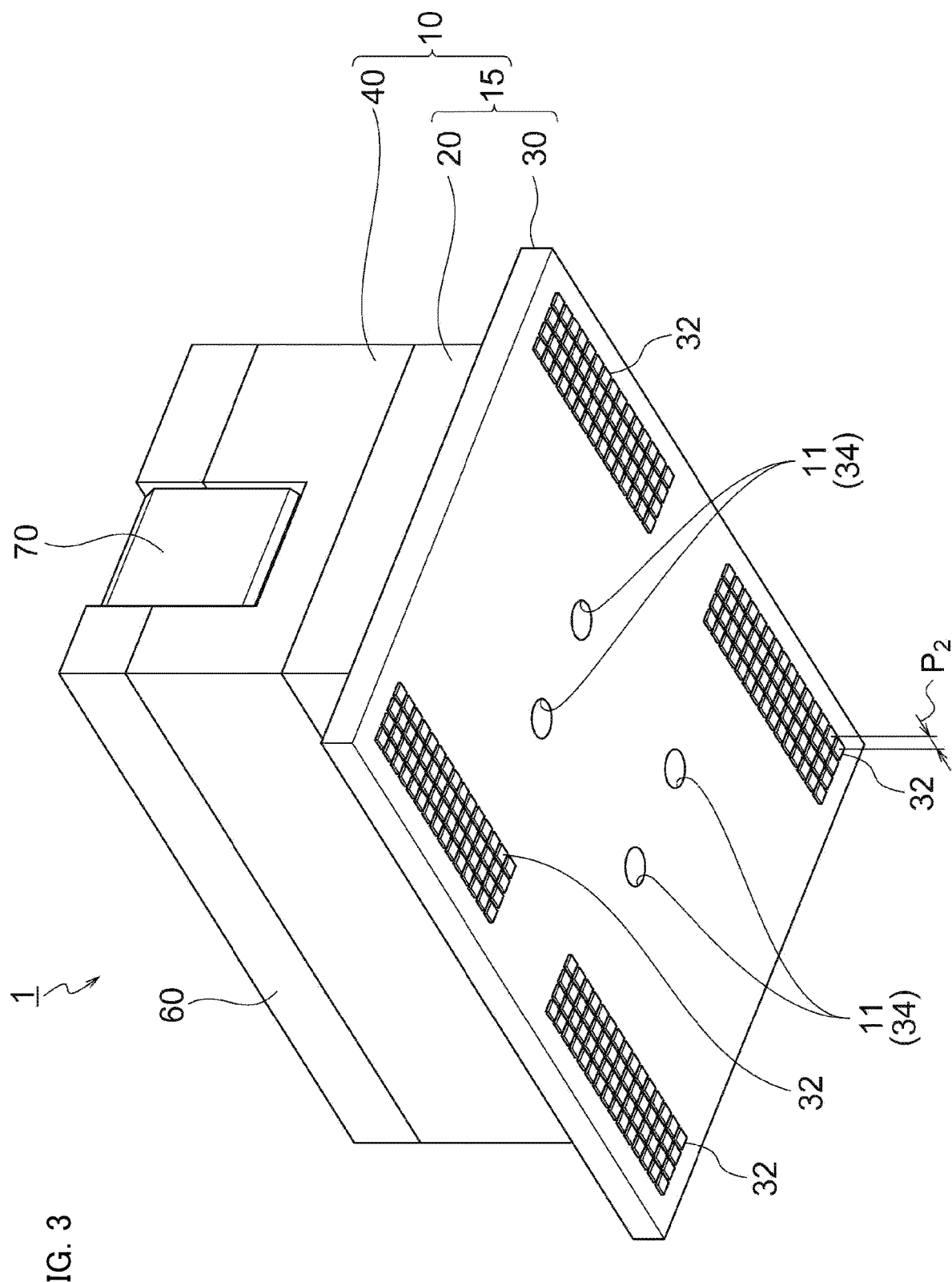
FIG. 3 is a perspective view of a test carrier in one or more embodiments of the present invention from below.
Figure 4:
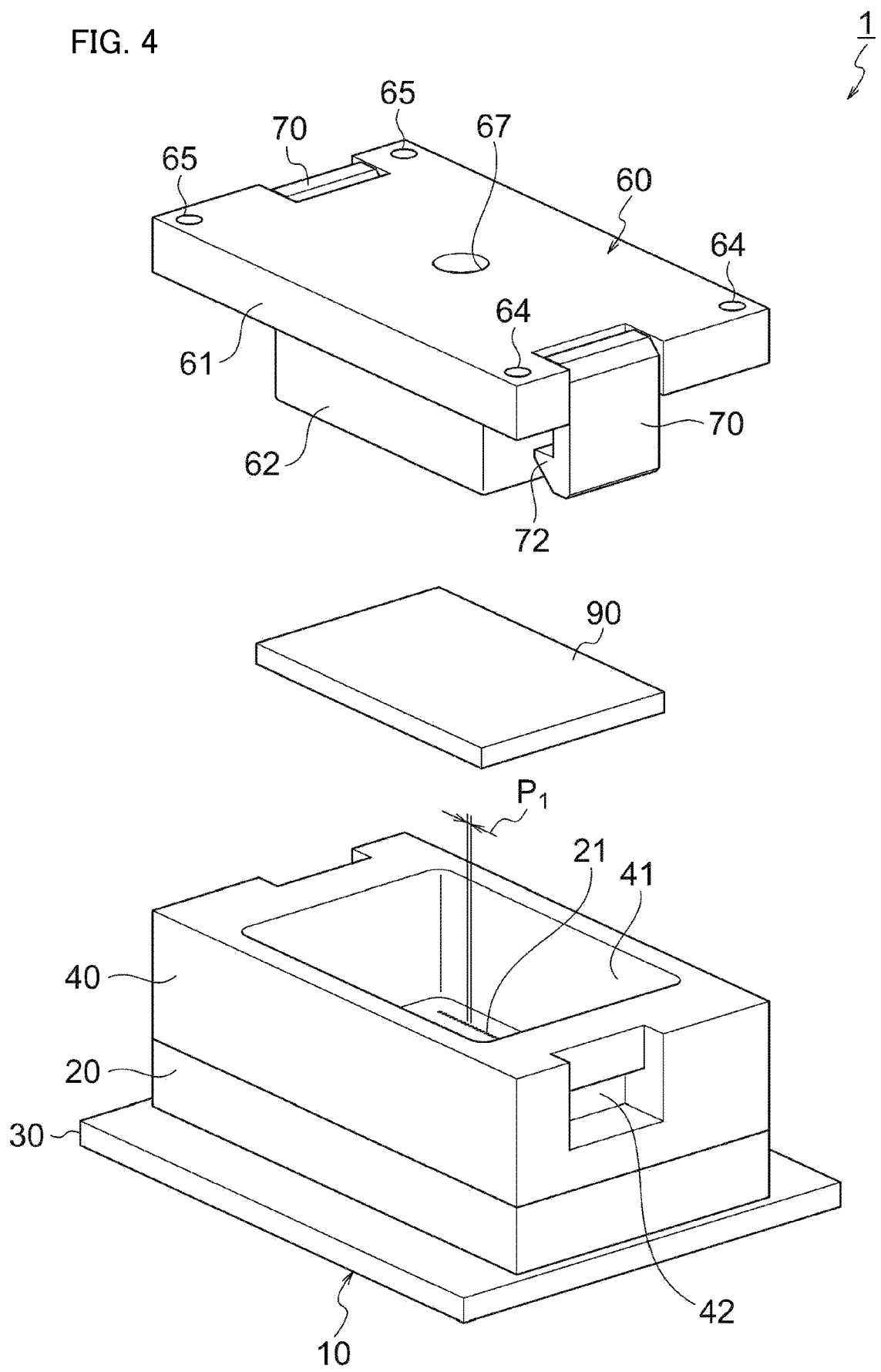
FIG. 4 is an exploded perspective view of a test carrier in one or more embodiments of the present invention.
Figure 5:
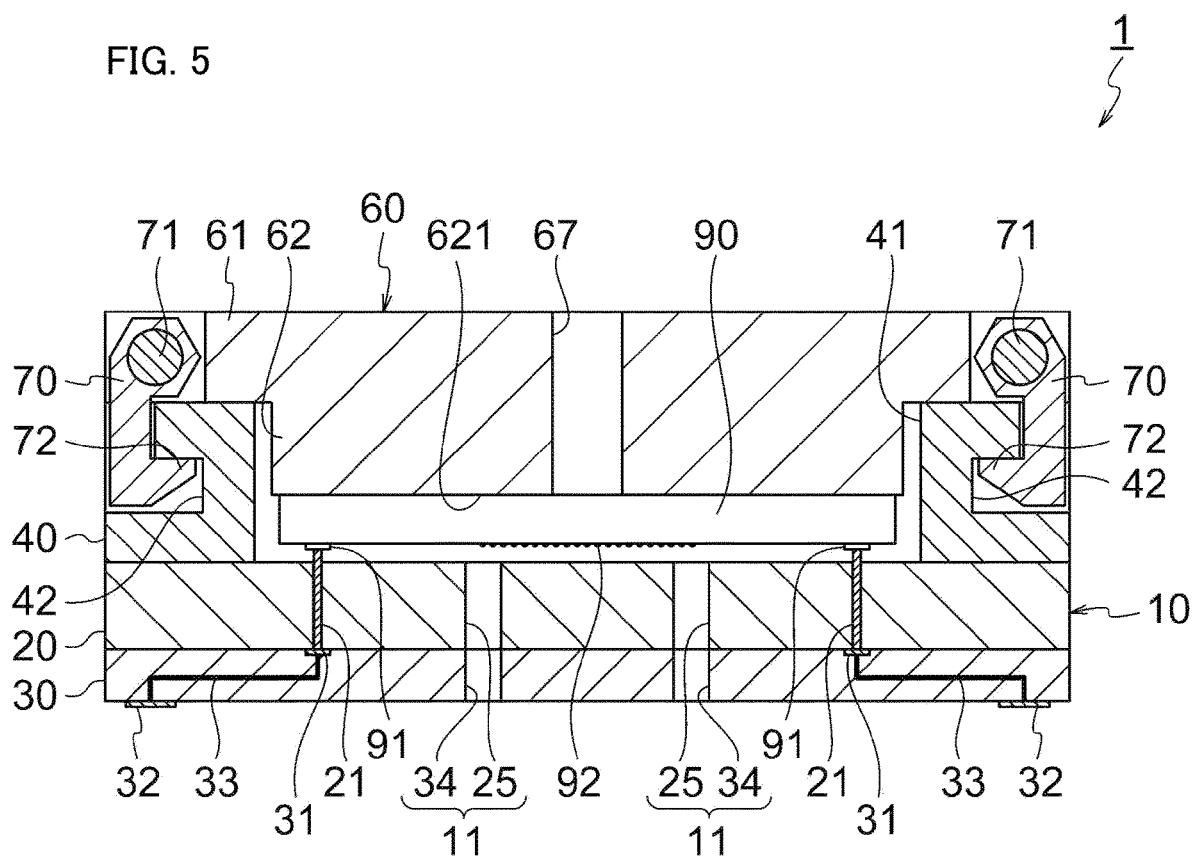
FIG. 5 is a cross-sectional view showing a test carrier in one or more embodiments of the present invention, is a diagram taken along the line V-V of FIG. 2.
Figure 6:
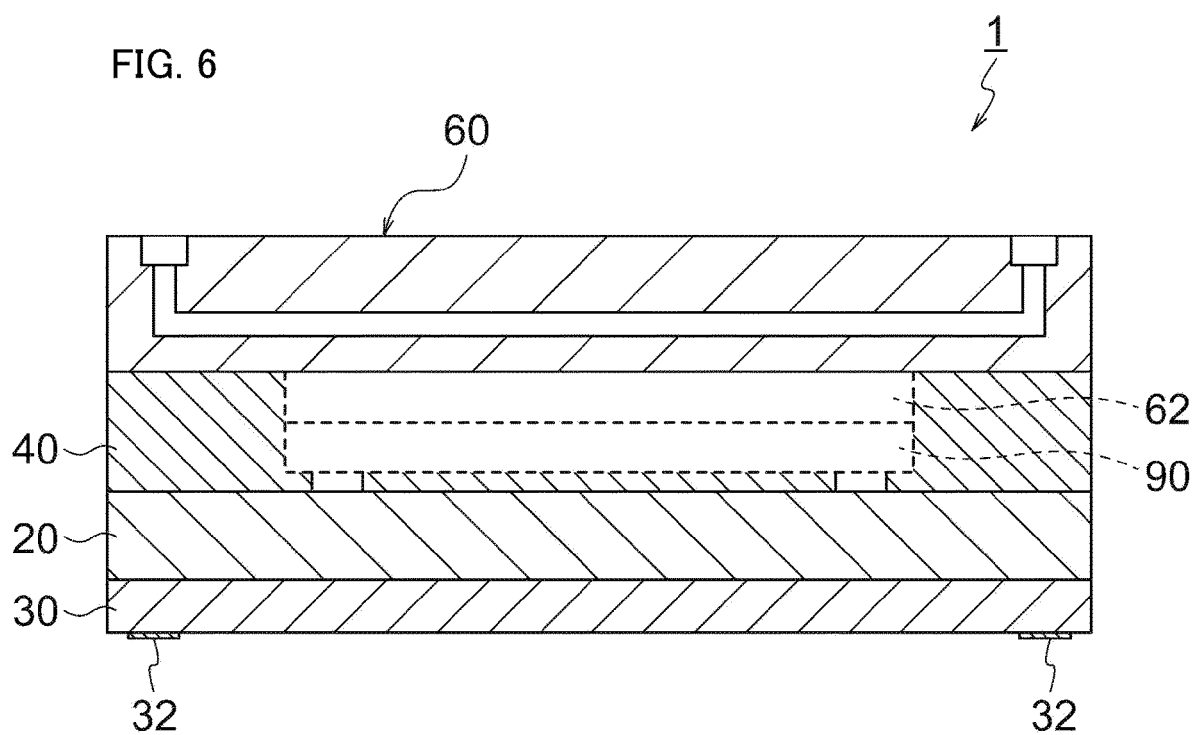
FIG. 6 is a sectional view showing a test carrier in one or more embodiments of the present invention, is a diagram taken along VI-VI of FIG. 2.
Figure 7:
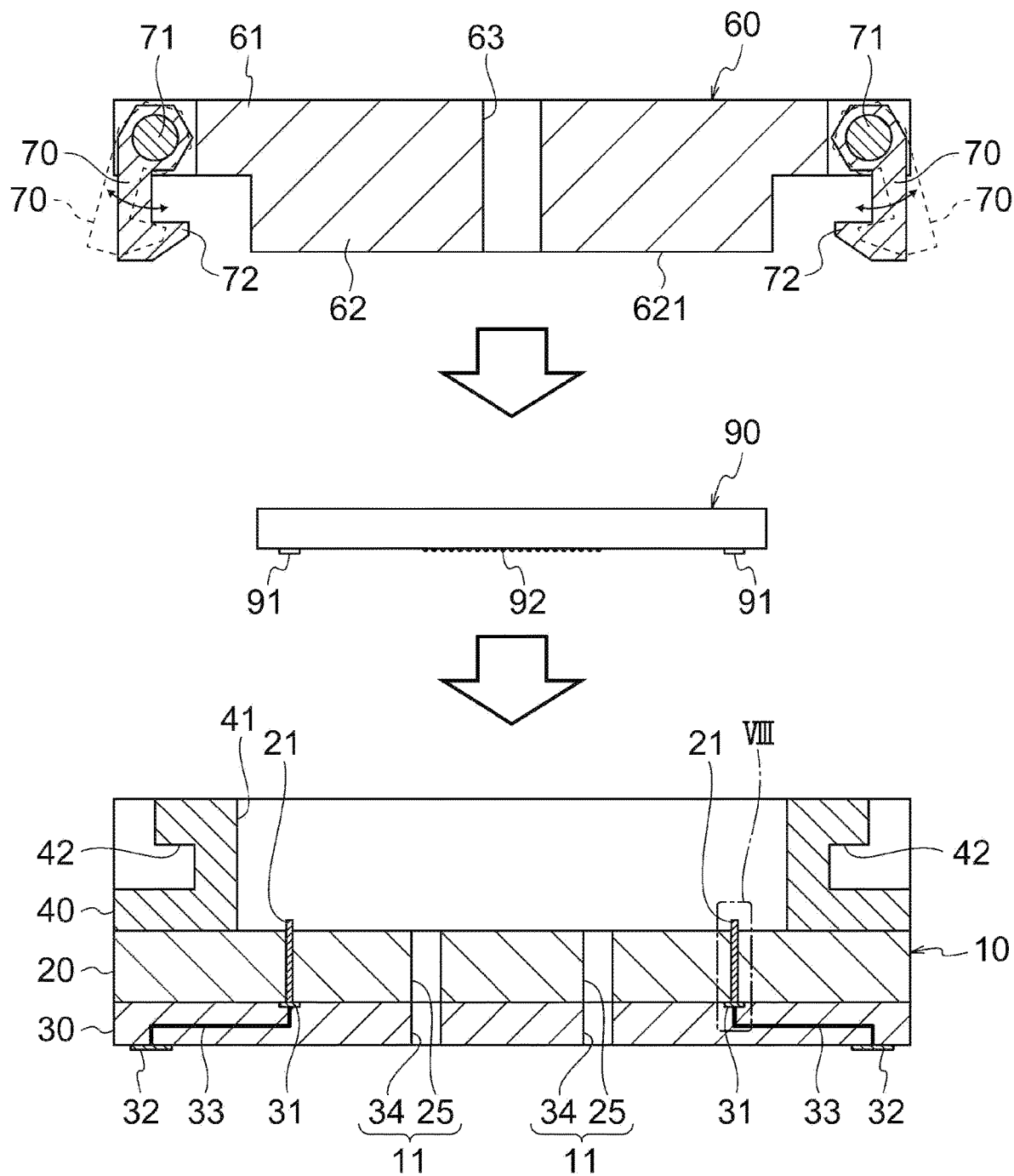
FIG. 7 is an exploded cross-sectional view showing a test carrier in one or more embodiments of the present invention.
Figure 8:
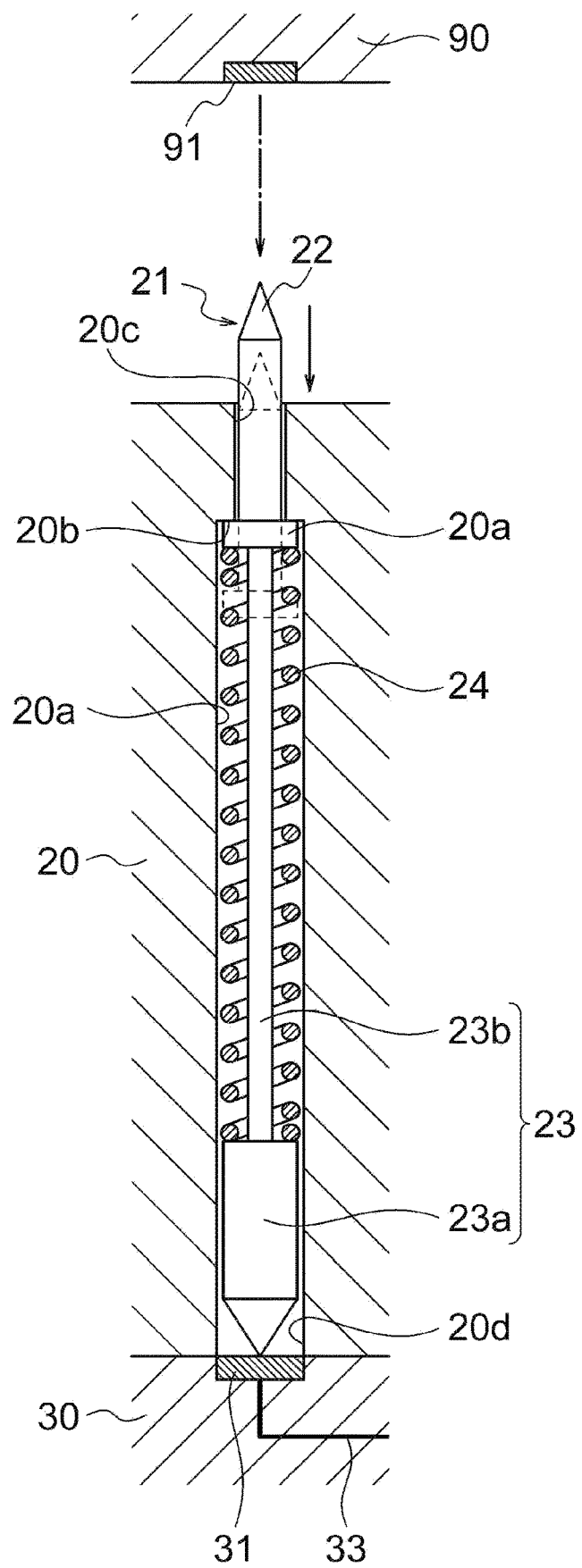
FIG. 8 is a sectional view showing a pogo pin of the test carrier in one or more embodiments of the present invention, is an enlarged view of VIII portion of FIG. 7.

FIGS. 2 and 3 are perspective view showing the test carrier in one or more embodiments, FIG. 4 is an exploded perspective view of the test carrier in one or more embodiments, FIGS. 5 and 6 are a cross-sectional view showing the test carrier in one or more embodiments, FIG. 7 is an exploded cross-sectional view showing the test carrier in one or more embodiments, FIG. 8 is a cross-sectional view showing a pogo pin of the test carrier in one or more embodiments.

As shown in FIGS. 2 to 7, the test carrier 1 in one or more embodiments includes a carrier body 10 for holding the DUT 90 and a lid member 60 which covers the DUT 90 and is detachably attached to the carrier body 10. The test carrier 1 can accommodate the DUT 90 by sandwiching the DUT 90 between the carrier body 10 and the lid member 60. The test carrier 1 basically has the same configurations as that of the carrier described in JP 2019-197012 A. The test carrier 1 corresponds to an example of "a test carrier" in one or more embodiments of the present invention.

The carrier body 10 includes a main body 15 and a tubular body 40 attached to the main body 15. The carrier body 10 corresponds to an example of "a carrier body" in one or more embodiments of the present invention.

The main body 15 includes a holding plate 20 and an interposer 30. The main body 15 holds pogo pins 21 (described later) and external terminals 32 (described later) to the carrier body 10. The main body 15 corresponds to an example of "a main body" in one or more embodiments of the present invention.

The holding plate 20 holds the pogo pins 21. The pogo pins 21 are arranged in a pitch $P_1$ so as to face the pads 91 of the DUT 90 (refer to FIG. 4). Each pogo pin 21, as shown in FIG. 8, includes a plunger 22, a fixing portion 23, a coil spring 24. The pogo pins 21 corresponds to an example of "contactors" in one or more embodiments of the present invention.

Each pogo pin 21 is disposed inside an each holding hole 20a of the holding plate 20. A flange 22a of the plunger 22 is engaged with a step 20b of the holding hole 20a, whereby an upper limit position of the plunger 22 is restricted. At this upper limit position, a distal end of the plunger 22 protrudes from a hole 20c on an upper side of the holding hole 20a. The fixing portion 23 includes a rear end 23a positioned in the opposite side hole 20d of the holding hole 20a and a shaft portion 23b extending from the rear end 23a toward the distal end (upward). The shaft portion 23b is inserted into the coil spring 24, and the coil spring 24 is interposed between the flange 22a of the plunger 22 and the rear end 23a of the fixing portion 23. When the DUT 90 is accommodated in the test carrier 1, the plunger 22 comes into contact with the pad 91 of the DUT 90, the plunger 22 presses the pad 91 by an elastic force of the coil spring 24, and the DUT 90 is held by the pogo pin 21.

In addition, four holes 25 penetrating the holding plate 20 are formed in the holding plate 20 (see FIG. 5). Each of the holes 25 is disposed to face a bump 92 positioned at a corner among the plurality of bumps 92 arranged in the rectangular shape on a lower surface of the DUT 90.

The interposer 30 is stacked on the lower surface of the holding plate 20 and fixed to the holding plate 20 by thread fastening, etc. As illustrated in FIG. 4 to FIG. 6, the interposer 30 includes internal terminals 31, external terminals 32, and wiring patterns 33.

The internal terminals 31 are provided on an upper surface of the interposer 30. The internal terminals 31 are arranged at a pitch $P_1$ to face the pogo pins 21 held by the holding plate 20, and the fixing portions 23 of the pogo pins 21 are in contact with the internal terminals 31.

The external terminals 32 are disposed on the lower surface of the interposer 30, and are exposed to the outside of the test carrier 1. The external terminals 32 are terminals that electrically connect contactors 321 (see FIGS. 10 to 12) of the socket 320 of the electronic component testing apparatus 100 during the test of the DUT 90. The external terminals 32 are arranged with a pitch $P_2$ wider than the pitch $P_1$ of inner terminals 31 (see FIG. 3) ($P_2$>$P_1$). The internal terminals 31 and the external terminals 32 are connected by wiring patterns 33. The external terminals 32 corresponds to an example of "external terminals" in one or more embodiments of the present invention.

Further, as shown in FIG. 3, the interposer 30 includes four holes 34 penetrating the interposer 30. Each of holes 34 is disposed to be substantially coincident with the hole 25 of the holding plate 20 described above. Therefore, first through-holes 11 linearly penetrating the carrier body 10 are formed by the holes 25 and 34. A part of the DUT 90 can be seen from the outside through the first through-holes 11. The first through-holes 11 are used for positioning the DUT 90 with high accuracy with respect to the test carrier 1 during assembling the test carrier 1.

Figure 9:
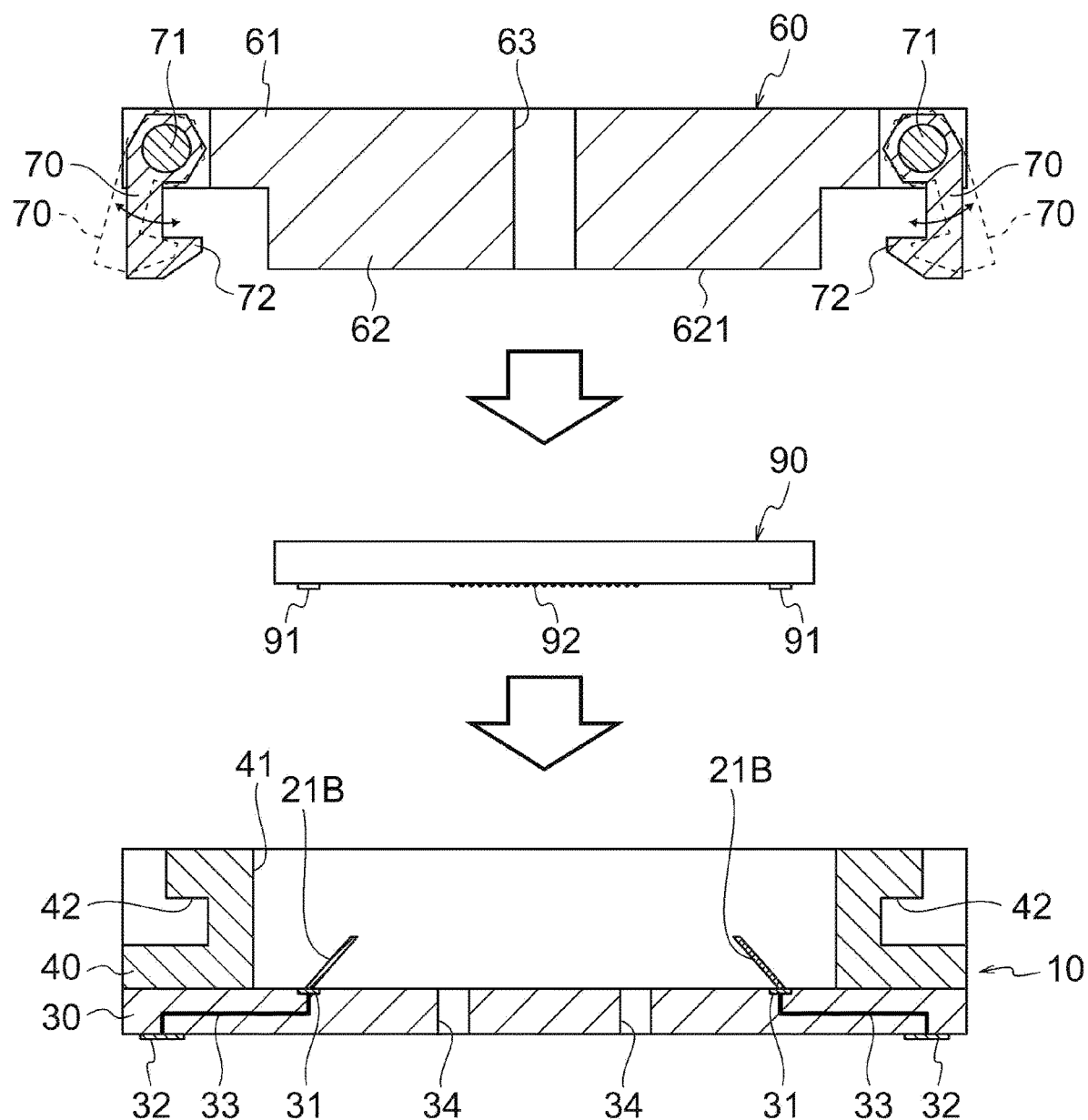
FIG. 9 is an exploded sectional view showing a modification of the carrier body of the test carrier in one or more embodiments of the present invention.

FIG. 9 is an exploded sectional view showing a modification of the main body of the test carrier in one or more embodiments.

In one or more embodiments, as contactors for contacting the pads 91 of the DUT 90, pogo pins 21 are used, but it may be used other than the pogo pins 21 as contactors. For example, as shown in FIG. 9, cantilever-type probe needles 21B may be used as the contactors. This probe needle 21B is mounted on the interposer 30 and is electrically connected to the inner terminal 31 of the interposer 30. Alternatively, although not shown in particular, as the contactor of the test carrier 1, a contactor including an anisotropic conductive rubber sheet, a membrane type contactor having bumps formed on the insulating film may be used.

In the case of using the pogo pins 21 as contactors, as described above, the main body 15 includes the holding plate 20 for holding the pogo pins 21. In contrast, as shown in FIG. 9, in the case of using the probe needles 21B as contactor, the main body 15 may include only the interposer 30. In this modification, the interposer 30 corresponds to an example of "a main body" in one or more embodiments of the present invention, and the probe needles 21B correspond to an example of "contactors" in one or more embodiments of the present invention.

Returning to FIG. 2 to FIG. 6, the tubular body 40 is provided on the upper surface of the holding plate 20 and is fixed to the holding plate 20 by thread fastening, etc. The tubular body 40 has a rectangular tubular shape having an inner hole 41 larger than the outer shape of the DUT 90 and can surround a periphery of the DUT 90 held by the holding plate 20. A recess 42 is formed on a side surface of the tubular body 40 to correspond to a latch 70 (described below) of the lid member 60. The latch 70 is engaged with the recess 42, whereby the lid member 60 is detachably attached to the carrier body 10.

The lid member 60 includes a plate-like main body 61, a convex portion 62 protruding downward from the main body 61 in a convex shape, and a pair of latches 70 protruding downward from both ends of the main body 61. The lid member 60 corresponds to an example of "a lid member" in one or more embodiments of the present invention.

The convex portion 62 has a contact surface 621 which contacts the upper surface of the DUT 90 held by the holding plate 20. The convex portion 62 presses the DUT 90. A pressing amount of the DUT 90 by the pusher 62 is limited by the tubular body 40 of the carrier body 10 abutting against the main body 61 of the lid member 60. In this state, a pressing force of the pogo pin 21 with respect to the pad 91 of the DUT 90 is set to an optimum value. The DUT 90 accommodated in the test carrier 1 is sandwiched between the pogo pins 21 and the convex portion 62. The contact surface 621 of the convex portion 62 corresponds to an example of "a contact surface" in one or more embodiments of the present invention.

A second through-hole 67 penetrating through the main body 61 and the convex portion 62 is formed substantially at a center of the main body 61. The second through-hole 67 is used for sucking and holding the DUT 90 by the carrier assembling apparatus (not illustrated).

In one or more embodiments, the flow passages 63 are formed in the lid member 60. Each flow passage 63 includes a supply hole (inlet) 64, an exhaust hole (outlet) 65, and a flow hole 66. The flow passage 63 corresponds to an example of "a first flow passage" in one or more embodiments of the present invention.

The supply hole 64 is provided on the upper surface of the lid member 60 and opens toward the upper portion of the lid member 60. The supply hole 64 can communicate with the carrier connection hole 230 of the pusher 210 (described later) by the test carrier 1 contacting the pusher 210 of the handler 200 during the test of the DUT 90. From the supply hole 64, air enters into the test carrier 1 through the pusher 210 and circulates to the flow hole 66. In one or more embodiments, two supply hole 64 are formed on the lid member 60. The supply hole 64 corresponds to an example of "a first connection hole" in one or more embodiments of the present invention.

The exhaust hole 65 is disposed on the upper surface of the lid member 60 and opens toward the upper portion of the lid member 60. The exhaust hole 65 can communicate with the carrier connection hole 240 of the pusher 210 (described later) by the test carrier 1 contacting the pusher 210 of the handler 200 during the test of the DUT 90. From the exhaust hole 65, air is exhausted to the outside of the test carrier 1. In one or more embodiments, two exhaust holes 65 are formed on the lid member 60. The exhaust hole 65 corresponds to an example of "a second connection hole" in one or more embodiments of the present invention.

The flow hole 66 is a hole formed in the main body 61 of the lid member 60. One end of the flow hole 66 communicates with the supply hole 64, the other end of the flow hole 66 communicates with the exhaust hole 65. That is, the flow hole 66 is a flow passage embedded within the lid member 60. Air supplied from the pusher 210 of the handler 200 performs heat exchange with the DUT 90 accommodated in the test carrier 1 by passing through the flow hole 66. Thereby the DUT 90 is cooled. In one or more embodiments, one of the flow holes 66 connects one of the supply holes 64 and one of the exhaust holes 65, and two flow holes are formed in the lid member 60. The flow hole 66 corresponds to an example of "a flow hole" in one or more embodiments of the present invention.

In one or more embodiments, although two supply holes 64 and two exhaust hole 65 are formed on the lid member 60, the number of the supply hole 64 and the exhaust hole 65 is not particularly limited thereto. Further, the number of the supply hole 64 may be different from the number of the exhaust hole 65.

In one or more embodiments, the flow hole 66 is formed inside the main body 61 of the lid member 60, the arrangement of the flow hole 66 is not particularly limited thereto. For example, the flow hole 66 may be formed over the inside of the main body 61 and the inside of the convex portion 62. If the flow hole 66 is formed inside the convex portion 62 in contact with the DUT 90, since the air circulates in the vicinity of the DUT 90, it is possible to cool the DUT 90 more efficiently.

In one or more embodiments, although the flow hole 66 is formed so as to connect one of the supply holes 64 and one of the exhaust holes 65, the configuration of the flow hole 66 is not particularly limited thereto. For example, with respect to one flow hole 66, supply holes 64 and exhaust holes 65 may be communicated. Alternatively, the flow hole 66 connected to one supply hole 64 may be branched in the middle and may be connected to the exhaust holes 65. Alternatively, the flow hole 66 connected to the supply holes 64 may merges and be connected to one exhaust hole 65.

Further, as far as the flow hole 66 penetrates the lid member 60 so as to connect the supply hole 64 and the exhaust hole 65, the size of the inside of the flow hole 66 is not particularly limited. For example, the flow hole 66 may be a linear through-hole having an inner diameter comparable to the inner diameter of the supply hole 64 and the exhaust hole 65. Alternatively, the flow hole 66 may be a space having a large width several times the inner diameter of the supply hole 64 and the exhaust hole 65.

In one or more embodiments, the flow hole 66 is extended in a straight line, the shape of the flow hole 66 is not particularly limited thereto. For example, the flow hole 66 may have a serpentine shape. Further, in order to increase the heat exchange efficiency, protrusions such as fins may be formed in the flow hole 66.

The latches 70 are rotatably supported by shafts 71 at both ends of the main body 61, and each of the latches extends downward. Each of the latches 70 is urged inward by a spring (not particularly illustrated). A claw 72 protruding inward is provided at a distal end of each of the latches 70. The lid member 60 is attached to the carrier body 10 by the claw 72 engaged with the recess 42 of the carrier body 10.

The test carrier 1 described above is assembled by the method described in JP 2019-197012 A using an assembly apparatus having an image processing apparatus.

Next, the configuration of the electronic component testing apparatus 100 in one or more embodiments will be described below with reference to FIGS. 1, 10 and 11.

Figure 10:
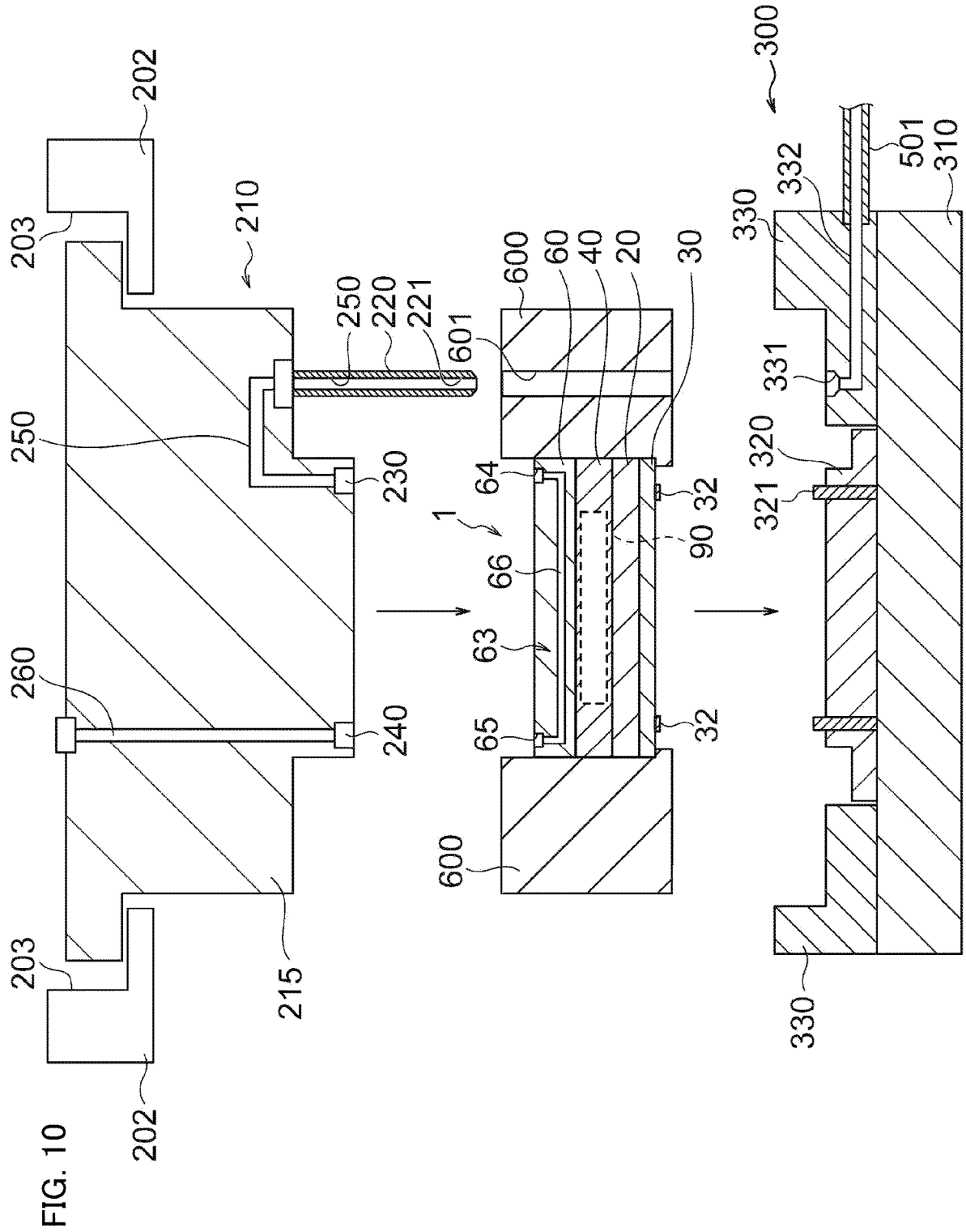
FIG. 10 is a cross-sectional view showing a state of testing by the electronic component testing apparatus in one or more embodiments of the present invention (Part 1), an enlarged sectional view showing the X portion of FIG. 1.

FIG. 10 is a cross-sectional view showing a state of testing by the electronic component testing apparatus in one or more embodiments (No. 1), and is an enlarged sectional view showing the X portion of FIG. 1. Further, FIG. 11 is a cross-sectional view showing a state of testing by the electronic component testing apparatus in one or more embodiments (No. 2).

As shown in FIG. 1, the electronic component testing apparatus 100 in one or more embodiments includes a handler 200, a test head 300, a tester 400, and a supply device 500. As described above, the electronic component testing apparatus 100 executes the test of the DUT 90. In this time, the DUT 90 is accommodated the DUT 90 in the test carrier 1.

Handler 200 includes a Z-axis drive unit 201 and a pusher 210. The Z-axis drive unit 201 includes an actuator for vertical drive (not illustrated), the z-axis drive unit 201 can move in the vertical direction. Although not illustrated, the handler 200 includes pushers 210 corresponding to test carriers 1 mounted on the test tray, the pushers 210 are attached to single Z-axis drive unit 201. In the handler 200, the pusher 210 attached to the Z-axis drive unit 201 contacts the test carrier 1 by the Z-axis drive unit 201 lowering, and the pusher 210 presses the test carrier 1 to the socket 320 (described later) of the test head 300. The pusher 210 corresponds to an example of "a pusher" in one or more embodiments of the present invention.

As shown in FIG. 10, the pusher 210 is inserted into the through-hole 203 formed in a match plate 202, is held in floating state (a state in which relative movement to the vertical is allowed) by the match plate 202. The pusher 210 includes a main body 215, a first connection pin 220, a carrier connection holes 230,240, and a vent passages 250, 260.

The first connecting pin 220 extends downward from the main body 215 of the pusher 210. The shape of the lower end of the first connecting pin 220 is narrower toward the lower. When the test of the DUT 90 is executed, the first connecting pin 220 penetrates the through-hole 601 of the insert 600 placed on the test head 300 with the lowering of the pusher 210, the first connecting pin 220 is detachably fitted into the first fitting hole 331 (described later) of the socket guide 330 (described later). Thus, the test carrier 1 held in the insert 600 is positioned with respect to the socket 320. The first connection pin 220 corresponds to an example of "a first connection pin" in one or more embodiments of the present invention.

Further, a part of the ventilation passage 250 is formed inside the first connection pin 220, a hole 221 is formed at the tip of the first connection pin 220. The pusher goes down, the lower end of the first connection pin 220 is communicated with the first fitting hole 331 of the socket guide 330. Thereby, the ventilation passage 250 communicates with the ventilation passage 332 (described later) inside the socket guide 330. This allows air supplied from the socket guide 330 of the test head 300 to flow through the ventilation passage 250. The hole 221 of the first connection pin 220 corresponds to an example of "a fourth connection hole" in one or more embodiments of the present invention.

Carrier connection holes 230 are formed on the lower portion of the main body 215 of the pusher 210. The carrier connection hole 230 corresponds to the supply hole 64 of the test carrier 1. The carrier connection hole 230 communicates with the supply hole 64 of the test carrier 1 with the pusher 210 going down and contacting to the test carrier 1. The carrier connection hole 230 corresponds to an example of "a third connection hole" in one or more embodiments of the present invention.

The carrier connection holes 240 also is formed on the lower portion of the main body 215 of the pusher 210. The carrier connection hole 240 corresponds to the exhaust hole 65 of the test carrier 1. The carrier connection hole 240 communicates with the exhaust hole 65 with the pusher 210 going down and contacting the test carrier 1. The carrier connection hole 240 corresponds to an example of "a fifth connection hole" in one or more embodiments of the present invention.

The ventilation passage 250, as described above, a portion thereof is formed inside the first connection pin 220, the other portion is formed inside the main body 215 of the pusher 210. One end of the ventilation passage 250 communicates with the ventilation passage 332 of the socket guide 330 with the first connecting pin 220 connecting to the socket guide 330 during testing of the DUT 90. The other end of the ventilation passage 250 is communicates with the carrier connection hole 230. Air supplied from the socket guide 330 is supplied to the test carrier 1 through the ventilation passage 250. The ventilation passage 250 corresponds to an example of "a second flow passage" in one or more embodiments of the present invention.

The ventilation passage 260 is disposed inside the main body 215 of the pusher 210, one end of the ventilation passage 260 communicates with the carrier connection hole 240, the other end of the ventilation passage 260 communicates with the outside of the pusher 210. The carrier connection hole 240 communicates with the exhaust hole 65 of the test carrier 1 with the pusher 210 going down and contacting the test carrier 1. On the other hand, air exhausted from the test carrier 1 is exhausted to the outside of the pusher 210 through the ventilation passage 260. The ventilation passage 260 corresponds to an example of "a third flow passage" in one or more embodiments of the present invention.

The test head 300 includes a main body 310, a socket 320, and a socket guide 330.

The main body 310, as shown in FIG. 1, is connected to the tester 400 via a cable 401, and sends a test signal to the DUT 90 during the test of the DUT 90. Although not illustrated, the pin electronics card which is electrically connected to the socket 320 is housed in the main body 310.

Figure 11:
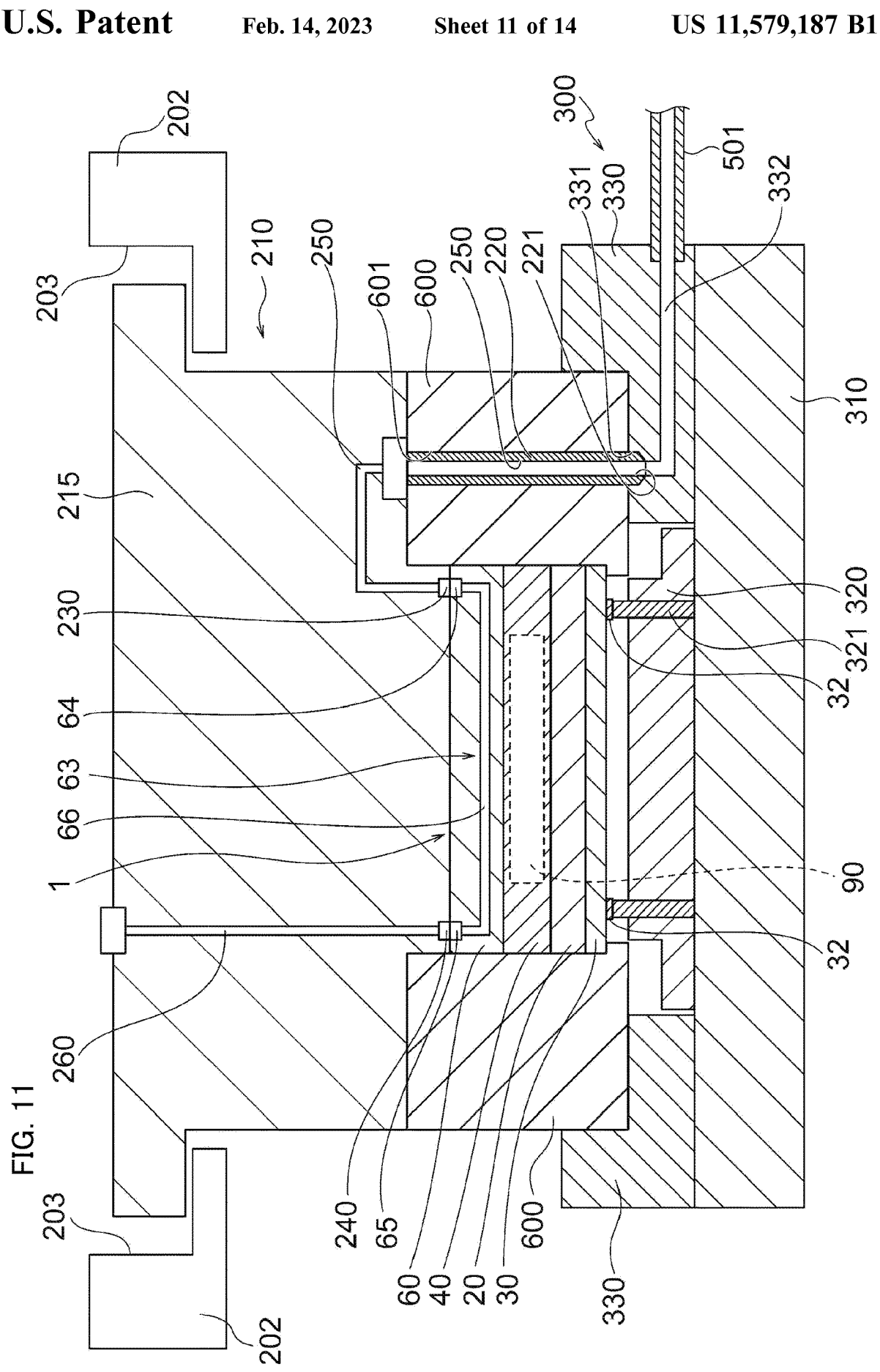
FIG. 11 is a cross-sectional view showing a state of test by the electronic component testing apparatus according to one or more embodiments of the present invention (Part 2)

The socket 320, as shown in FIGS. 10 and 11, is disposed on the main body 310. The socket 320 includes contactors 321 disposed so as to correspond to the external terminals 32 of the test carrier 1. Pogo pin or anisotropic conductive rubber sheet can be used as the contactor 321, but the contactor 321 is not limited thereto. The test carrier 1 held by the insert 600 of the test tray is pressed to the socket 320 by the pusher 210, the external terminals 32 of the test carrier 1 contact to the contactors 321 of the socket 320, and the DUT 90 and the socket 320 is electrically connected via the test carrier 1. The test signal is sent from the main body 310 to the DUT 90 through the socket 320.

The socket guide 330 is disposed around the socket 320. The socket guide 330 includes a first fitting hole 331 and a ventilation passage 332. The socket guide 330 positions the test carrier 1 with respect to the socket 320. The socket guide 330 also positions the pusher 210 with respect to the socket 320.

The first fitting hole 331 is disposed on the upper surface of the socket guide 330 and disposed at a position corresponding to the first connection pin 220. The first fitting hole 331 has a shape that fits the first connection pin 220. This first fitting hole 331 opens upward. The first fitting hole 331 corresponds to an example of "a first fitting hole" in one or more embodiments of the present invention.

The ventilation passage 332 is formed in the socket guide 330. One end of the ventilation passage 332 communicates with the first fitting hole 331. The other end of the ventilation passage 332 also communicates with the supply passage 501. As illustrated in FIGS. 10 and 11, the first connection pin 220 is fitted into the first fitting hole 331, the ventilation passage 250 communicates with the ventilation passage 332.

A supply device 500, although not illustrated in particular, includes a pump for supplying air, a valve for adjusting the flow rate, and a temperature controller for adjusting the temperature of the air. As illustrated in FIGS. 1, 10 and 11, the supply device 500 communicates with the ventilation passage 332 of the socket guide 330 through a supply passage 501. The supply device adjusts a temperature of air to an appropriate temperature according to the conditions of the test. The supply device supplies the temperature adjusted air to the socket guide 330. In one or more embodiments, the supply device 500 is disposed inside the handler 200, but it is not particularly limited thereto, the supply device 500 may be disposed inside the test head 300 or the like.

Hereinafter, the process of testing the DUT 90 using the test carrier 1 and the electronic component testing apparatus 100 in one or more embodiments will be described below with FIGS. 10 and 11.

First, the insert 600 of the test tray (not shown) accommodates the test carrier 1 accommodating the DUT 90. Specifically, the test carrier 1 is transferred to the test tray from the customer tray (not shown) with the pick-and-place device provided in the handler 200, the test carrier 1 is accommodated in the insert 600 of the test tray. Incidentally, the customer tray is a tray to be transported to the handler 200 from the pre-process, the test carrier 1 is assembled by the method described in JP 2019-197012A, then the test carrier 1 is accommodated in the customer tray.

Then, the transport apparatus of the handler 200 transfers the test tray to a position facing the test head 300. Then, as shown in FIG. 10, the Z-axis drive unit 201 is driven, the pusher 210 goes down, the pusher 210 presses the test carrier 1 held in the insert 600 of the test tray.

With the lowering of the pusher 210, the first connecting pin 220 penetrates the through-hole 601 of the insert 600, fitting to the first fitting hole 331 of the socket guide 330. Thus, the test carrier 1 held in the insert 600 is positioned with respect to the socket 320. The ventilation passage 250 formed in the first connection pin 220 of the pusher 210 and the ventilation passage 332 formed in the socket guide 330 are communicated with.

Further, with the lowering of the pusher 210, the pusher 210 presses the test carrier 1 to the socket 320, the external terminals 32 of the test carrier 1 contact the contactors 321 of the socket 320. Further, the carrier connection hole 230 of the pusher 210 is communicated with the supply hole 64, the carrier connection hole 240 is communicated with the exhaust hole 65 of the test carrier 1.

Then, the valve of the supply device 500 is opened and the supply device 500 starts to supply air. Air is supplied to the flow hole 66 from the supply hole 64 of the test carrier 1 through the supply passage 501, the ventilation passage 332 of the socket guide 330, the ventilation passage 250 of the pusher 210.

In this state, the test signal outputted from the tester 400 is sent to the DUT 90 through the contactors 321 of the socket 320, the test of the DUT 90 is performed.

When the DUT 90 is applied electricity, the DUT 90 generates heat (self-heating). Air supplied to the flow hole 66 absorbs heat generated by the DUT 90 to cool the DUT 90. Air passing through the flow hole 66 of the test carrier 1 enters the ventilation passage 260 from the exhaust hole 65 and the carrier connection hole 240, is exhausted to the outside (for example, the interior of the chamber) of the pusher 210.

When the test of the DUT 90 is completed, the pusher 210 is moved upward by the Z-axis drive unit 201, the test tray (not illustrated) holding the insert 600 accommodating the test carrier 1 is moved upward. Next, the test tray is removed from the position facing the test head 300 by the carry apparatus of the handler 200, then the test carrier 1 is transferred to the customer tray from the test tray by the pick-and-place device. Then, after the customer tray accommodating the test carrier 1 is carried out from the handler 200, the DUT 90 is taken out by disassembling the test carrier 1. The process of testing the DUT 90 is completed.

As described above, in one or more embodiments, when the test of the DUT 90, since air supplied from the outside of the test carrier 1 flows through the flow passage 63 formed in the test carrier 1, air circulates in the vicinity of the DUT 90. Thus, as compared with the case where air flows only inside the pusher, it is possible to reduce the thermal resistance of the test carrier 1. Therefore, it is possible to cool the DUT 90 efficiently, it is possible to suppress the rapid temperature rise due to heat generation of the DUT 90. In extension, it is possible to suppress the damage and yield reduction of the DUT 90 due to heat generation of the DUT 90.

Further, in one or more embodiments, air flows through the flow passage 63 formed in the test carrier 1, air doesn't be blown to the DUT 90 directly. As a result, it is possible to suppress the adhesion of dirt to the DUT 90 due to direct air contact with the DUT 90 and the electrification of the DUT 90 due to friction with air.

Further, in one or more embodiments, the DUT 90 is accommodated in the test carrier 1, the test of DUT90 is performed while the DUT 90 is sealed in the inner space of the test carrier 1. Therefore, devices or bare dies that require a high level of cleanliness (Class 5-6/Class 100-1000) in the handling environment can be tested using a handler in a lower cleanliness environment (Class 7/Class 10000).

It should be appreciated that the embodiments explained heretofore are described to facilitate understanding of the present invention and are not described to limit the present invention. It is therefore intended that the elements disclosed in the above embodiments include all design changes and equivalents to fall within the technical scope of the present invention.

Figure 12:
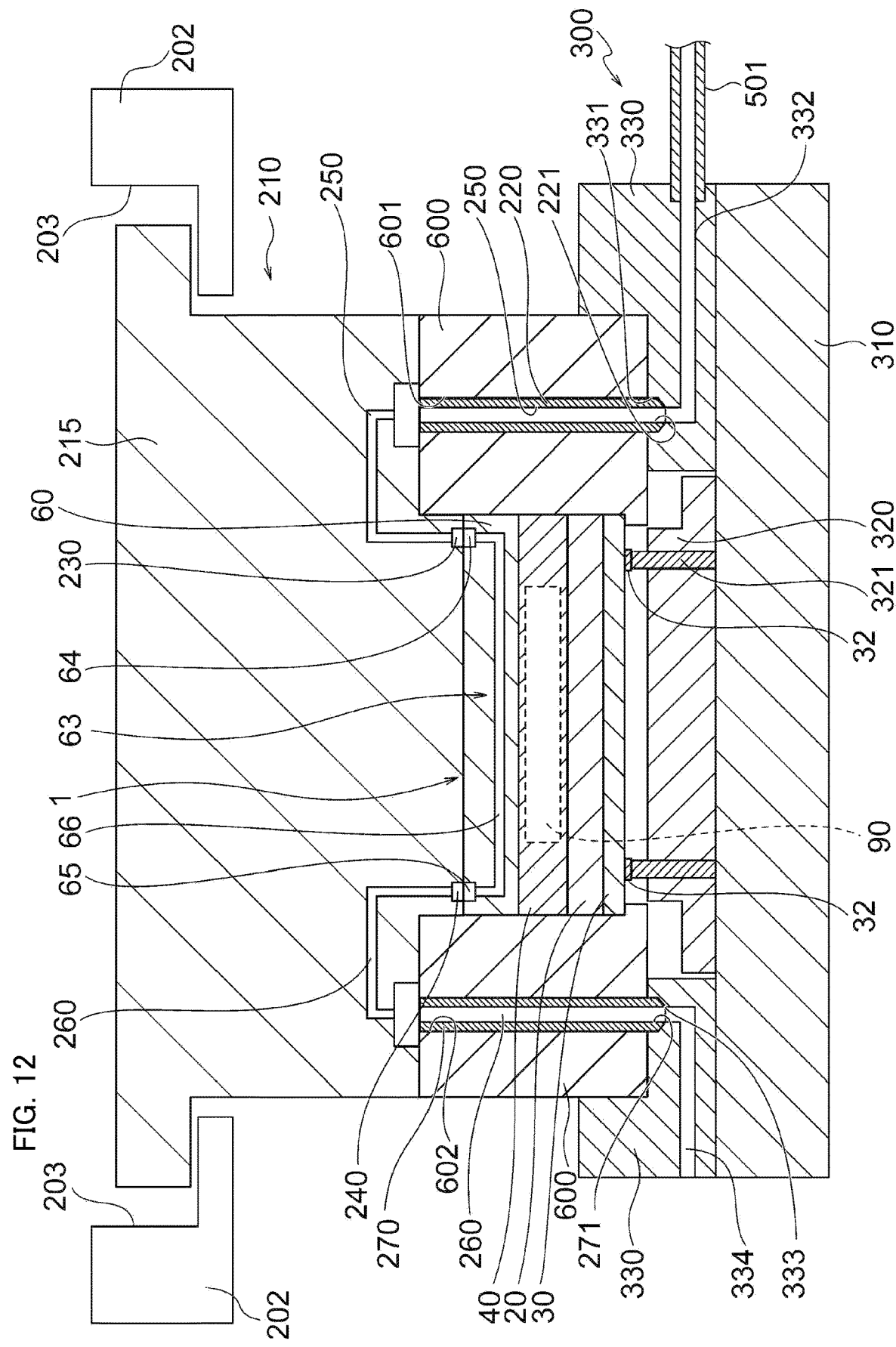
FIG. 12 is a diagram showing a first modification of the electronic component testing apparatus according to one or more embodiments of the present invention.
Figure 13:
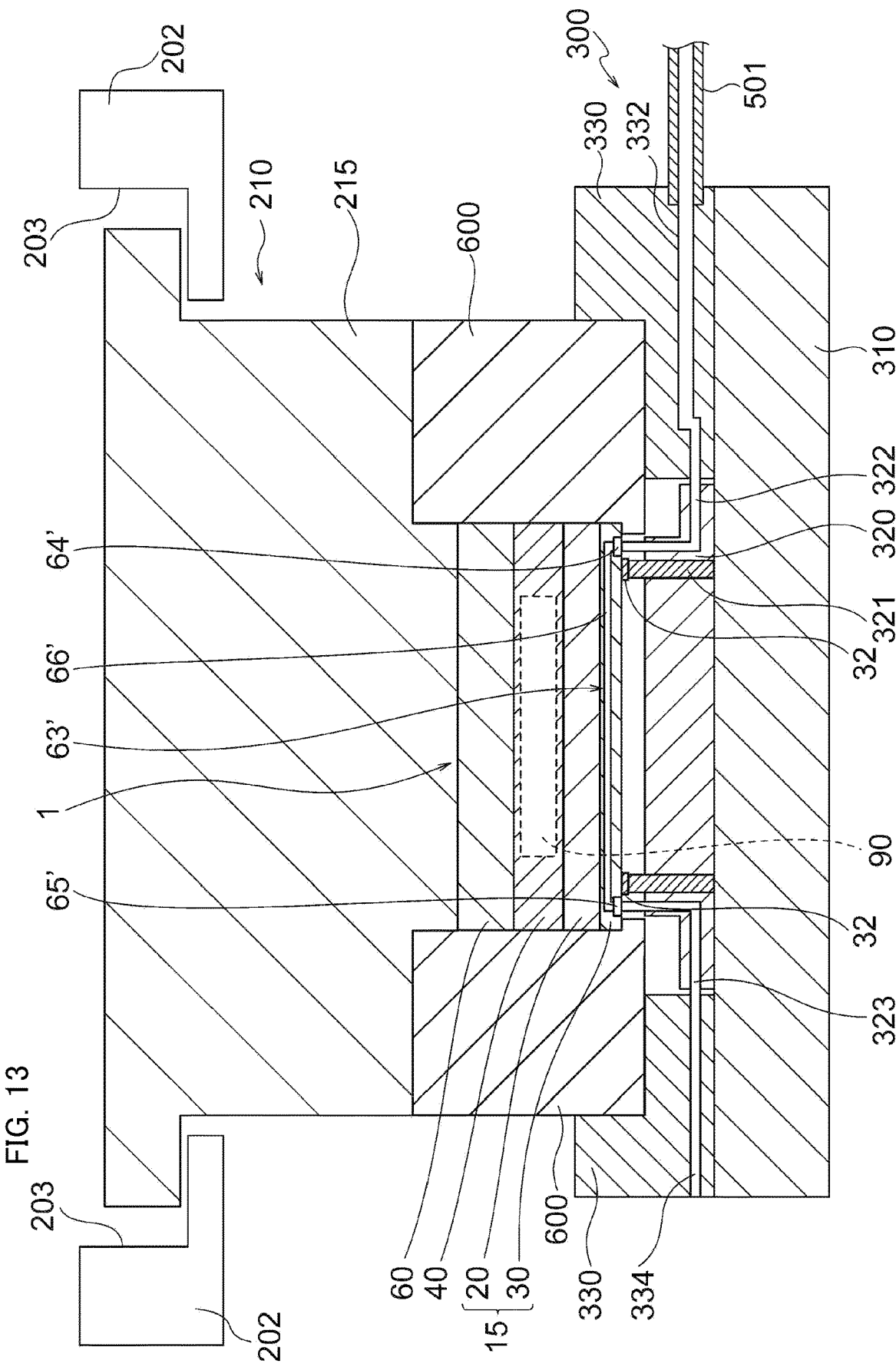
FIG. 13 is a diagram showing a modification of the second modification and the test carrier of the electronic component testing apparatus in one or more embodiments of the present invention.
Figure 14:
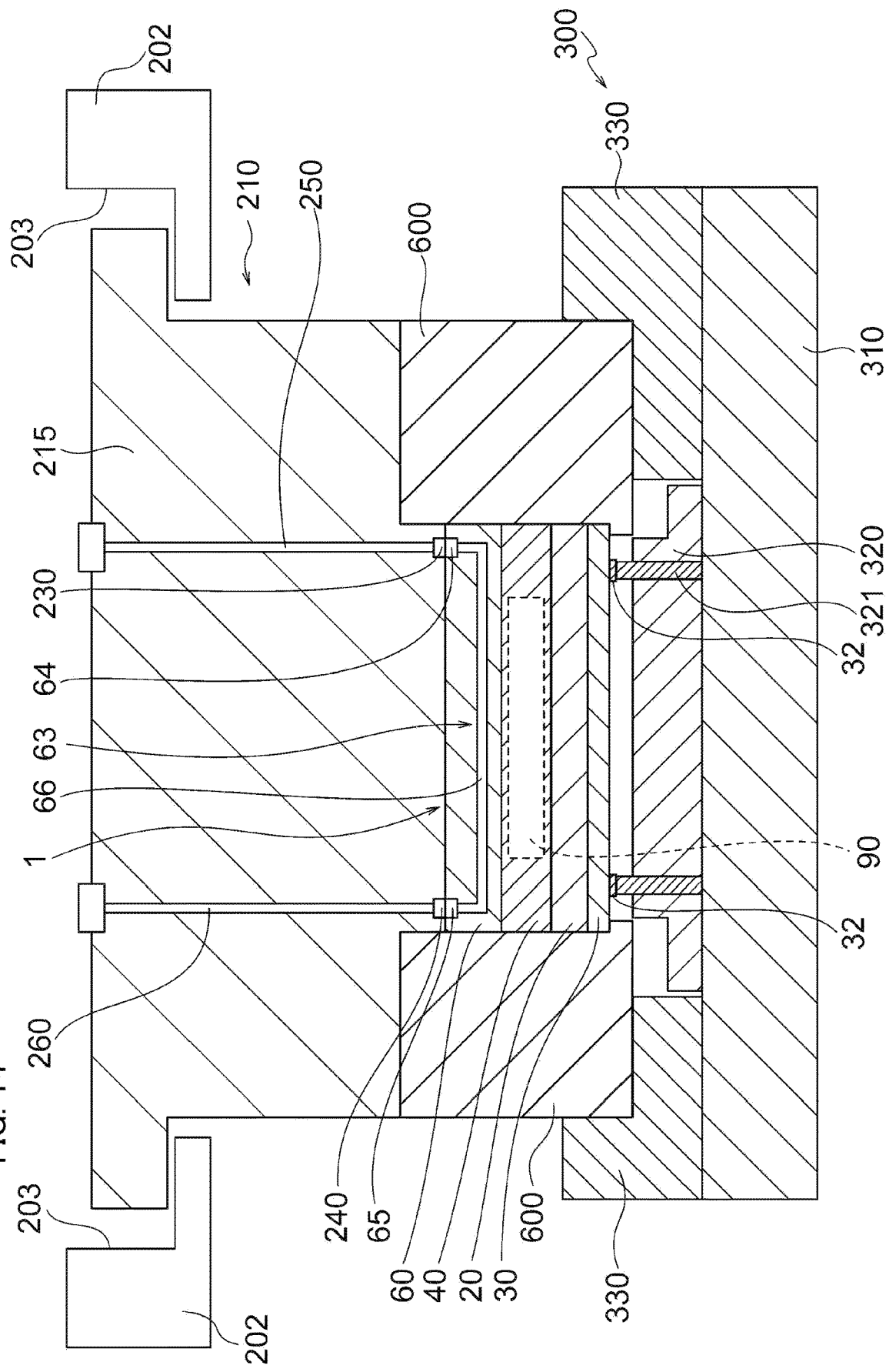
FIG. 14 is a diagram showing a third modification of the electronic component testing apparatus in one or more embodiments of the present invention.

FIGS. 12 to 14 are diagrams showing a modification of the electronic component testing apparatus according to one or more embodiments.

In the above embodiments, air is exhausted from the test carrier 1 is exhausted from the pusher 210 to the outside of the pusher 210, but the location for exhausting air is not particularly limited thereto. For example, as illustrated in FIG. 12, the pusher 210 includes a second connection pin 270 in addition to the first connection pin 220, the hole 271 is formed at the tip of the second connection pin 270, air can be exhausted to the outside of the test head 300 via the socket guide 330. The second connection pin 270 passes through the through-hole 602 formed in the insert 600 and is fitted to the second fitting hole 333 formed in the test head 300. A portion of the ventilation passage 260 in communication with the carrier connection hole 240 is formed inside the second connection pin 270. In the example of FIG. 12, with the lowering of the pusher 210, the first connection pin 220 is fitted to the first fitting hole 331, the second connection pin 270 is fitted to the second fitting hole 333. During the test of the DUT 90, air supplied from the supply device 500 is exhausted from the ventilation passage 334 to the outside of the test head 300 through the ventilation passage 250, the flow hole 66, and the ventilation passage 260. The second connection pin 270 corresponds to an example of "a second connection pin" in one or more embodiments of the present invention, the hole 271 of the second connection pin 270 corresponds to an example of "a sixth connection hole" in one or more embodiments of the present invention, the second fitting hole 333 corresponds to an example of "a second fitting hole" in one or more embodiments of the present invention.

In the above-described embodiments, although the flow passage 63 is formed in the lid member 60 of the test carrier 1, it is not particularly limited thereto. For example, as shown in FIG. 13, instead of the lid member 60, the flow passage 63' may be formed in the carrier body 10. In the form shown in FIG. 13, the flow passage 63' is formed in the interposer 30. The supply hole 64' and the exhaust hole 65' is formed on the lower surface of the interposer 30, the flow hole 66' is formed inside the interposer 30. In the socket 320, the ventilation passage 322 that communicates with the ventilation passage 332 of the socket guide 330 and the flow hole 66' of the interposer 30 is formed. Further, in the socket 320, the vent passage 323 communicating with the vent passage 334 of the socket guide 330 and the flow hole 66' of the interposer 30 is formed. Air supplied from the supply device 500 is exhausted to the outside of the test head 300 through the ventilation passage 332, the ventilation passage 322, the flow passage 63', the ventilation passage 323, and the ventilation passage 334.

Incidentally, the flow passage 63' is not particularly limited as far as it is formed in the main body 15 of the carrier body 10. For example, the flow passage 63' may be formed only on the holding plate 20. Alternatively, the flow passage 63' may be formed on both the holding plate 20 and the interposer 30.

In this modification, the ventilation passage is not formed in the pusher 210, the pusher 210 doesn't include the connection pin having the ventilation passage. Therefore, it is possible to simplify the structure of the pusher 210.

Incidentally, the test carrier 1 includes both of a flow passage 63 formed in the lid member 60 and the flow passage 63' formed in the carrier body 10.

In the above-described embodiments, air is supplied from the test head 300 to the test carrier 1 through the pusher 210, but is not particularly limited thereto. For example, as illustrated in FIG. 14, the pusher 210 doesn't include a connection pin 220, the ventilation passage 250 may be formed only in the main body 215 of the pusher 210. Although not illustrated, the ventilation passage 250 is connected to the supply device disposed outside the pusher 210. In the example illustrated in FIG. 14, air supplied from the supply device is supplied from the pusher 210 to the test carrier 1 without passing through the test head 300.

Further, for example, in the above-described embodiments, the die is exemplified as a specific example of the DUT 90, but the present invention is not particularly limited thereto. For example, the DUT 90 may be a packaged device. The DUT 90 in the above-described embodiments is a memory-based device but is not particularly limited thereto. For example, the DUT 90 may be SoCs (System on a chip) or logic-based devices.

Further, although the electronic component testing apparatus 100 in the above-described embodiments has a handler 200 of the type that presses the DUT 90 to the socket 320 while holding the DUT 90 in the test tray, the configuration of the handler 200 is not particularly limited thereto. For example, the handler 200 may be a type of handler that presses the DUT against a socket by an arm that sucks and holds the DUT.

Further, in the above embodiments, the test carrier 1 may include the supply hole 64 and the exhaust hole 65, and the pusher 210 may also include a carrier connection holes 230,240, it is not particularly limited thereto. The pusher 210 may include a connecting tube, the test carrier may include a supply hole where the connecting tube can be fitted. Alternatively, the test carrier 1 may include a connecting tube, the pusher 210 may include the fitting hole where the connection pin can be fitted.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . TEST CARRIER
  10 . . . CARRIER BODY
  15 . . . MAIN BODY
  20 . . . HOLDING PLATE
  21 . . . POGO PINS
  21B . . . PROBE NEEDLES
  30 . . . INTERPOSER
    31 . . . INTERNAL TERMINALS
    32 . . . EXTERNAL TERMINALS
    33 . . . WIRING PATTERN
  40 . . . TUBULAR BODY
  60 . . . LID MEMBER
    61 . . . MAIN BODY
      62 . . . CONVEX PORTION
        621 . . . CONTACT SURFACE
    63 . . . FIRST FLOW PASSAGES
    64 . . . SUPPLY HOLE
    65 . . . EXHAUST HOLE
    66 . . . FLOW HOLE
  70 . . . LATCH
90 . . . DUT
  91 . . . PADS
  92 . . . BUMPS
100 . . . ELECTRONIC COMPONENT TESTING APPARATUS
200 . . . HANDLER
  210 . . . PUSHER
    215 . . . MAIN BODY
    220 . . . FIRST CONNECTION PIN
      221 . . . HOLES
    230,240 . . . CARRIER CONNECTION HOLE
    250,260 . . . VENTILATION PASSAGE
    270 . . . SECOND CONNECTION PIN
      271 . . . HOLE
300 . . . TEST HEAD
  310 . . . MAIN BODY
  320 . . . SOCKET
    321 . . . CONTACTORS
    322,323 . . . VENTILATION PASSAGE
  330 . . . SOCKET GUIDE
    331 . . . FIRST FITTING HOLE
    332 . . . VENTILATION PASSAGE
    333 . . . SECOND FITTING HOLE
    334 . . . VENTILATION PASSAGE
400 . . . TESTER
500 . . . SUPPLY DEVICE
  501 . . . SUPPLY PASSAGE
600 . . . INSERT
  601,602 . . . THROUGH-HOLE

What is claimed is:

1. A test carrier that accommodates a device under test (DUT), comprising:
  a first flow passage through which fluid supplied from an outside of the test carrier flows; and
  an accommodating space that accommodates the DUT inside the test carrier, wherein
  the first flow passage comprises:
    a flow hole;
    a first connection hole that communicates with a first end of the flow hole; and a second connection hole that communicates with a second end of the flow hole, the test carrier is pressed by a pusher to a socket of a test head in a state that the accommodating space accommodates the DUT, and the fluid is supplied to the flow hole from the first connection hole and exhausted from the second connection hole.

2. The test carrier according to claim 1, further comprising:
a carrier body that holds the DUT; and
a lid that covers the DUT and is detachably attached to the carrier body, wherein
the flow hole, the first connection hole, and the second connection hole are formed in the lid.

3. The test carrier according to claim 2, wherein the carrier body comprises:
contactors correspond to terminals of the DUT;
external terminals electrically connected to the contactors; and
a main body that holds the contactors and the external terminals.

4. The test carrier according to claim 3, wherein the lid comprises:
a contact surface that contacts the DUT, and
the DUT is sandwiched between the contact surface and the contactors.

5. The test carrier according to claim 1, wherein the fluid is supplied to the first flow passage from the pusher.

6. The test carrier according to claim 5, wherein the first connection hole and the second connection hole face the pusher.

7. The test carrier according to claim 1, further comprising:
a carrier body that holds the DUT; and
a lid that covers the DUT and is detachably attached to the carrier body, wherein
the flow hole, the first connection hole, and the second connection hole are formed in the carrier body.

8. An electronic component testing apparatus for testing a device under test (DUT), comprising:
the test carrier according to claim 1;
the test head that comprises the socket; and
the pusher that presses the test carrier to the socket, wherein
the pusher supplies the fluid to the first flow passage.

9. The electronic component testing apparatus according to claim 8, wherein
the pusher comprises:
a third connection hole that communicates with the first flow passage while the pusher is contacting the test carrier;
a second flow passage that communicates with the third connection hole, and
the fluid is supplied to the first flow passage through the second flow passage while the pusher is pressing the test carrier to the socket.

10. The electronic component testing apparatus according to claim 8, wherein
the pusher comprises:
a fifth connection hole that communicates with the first flow passage while the pusher is contacting the test carrier; and
a third flow passage that communicates with the fifth connection hole, the fluid supplied to the first flow passage flows into the third flow passage while the pusher is pressing the test carrier to the socket.

11. The electronic component testing apparatus according to claim 10, wherein the pusher exhausts the fluid supplied to the first flow passage to an outside of the pusher from the third flow passage.

12. An electronic component testing apparatus for testing a device under test (DUT), comprising:
the test carrier according to claim 1;
the test head that comprises the socket; and
the pusher that presses the test carrier to the socket, wherein
the test head supplies the fluid to the first flow passage.

13. An electronic component testing apparatus for testing a device under test (DUT), comprising:
a test carrier that:
accommodates the DUT, and
comprises a first flow passage through which fluid supplied from an outside of the test carrier flows;
a test head that comprises a socket; and
a pusher that presses the test carrier to the socket, wherein
the pusher supplies the fluid to the first flow passage,
the pusher comprises:
a third connection hole that communicates with the first flow passage while the pusher is contacting the test carrier;
a second flow passage that communicates with the third connection hole, wherein the fluid is supplied to the first flow passage through the second flow passage while the pusher is pressing the test carrier to the socket; and
a fourth connection hole that connects to the test head and receives the fluid from the test head while the pusher is contacting the test head,
the fourth connection hole communicates with the second flow passage, and
the fluid is supplied to the first flow passage from the test head through the second flow passage while the pusher is pressing the test carrier to the socket.

14. The electronic component testing apparatus according to claim 13, wherein
the pusher comprises:
a first connection pin that fits into a first fitting hole formed in a socket guide of the test head, and
the third connection hole and a part of the second flow passage are formed in the first connection pin.

15. An electronic component testing apparatus for testing a device under test (DUT), comprising:
a test carrier that:
accommodates the DUT, and
comprises a first flow passage through which fluid supplied from an outside of the test carrier flows;
a test head that comprises a socket; and
a pusher that presses the test carrier to the socket, wherein
the pusher supplies the fluid to the first flow passage,
the pusher comprises:
a fifth connection hole that communicates with the first flow passage while the pusher is contacting the test carrier;
a third flow passage that communicates with the fifth connection hole, wherein the fluid supplied to the first flow passage flows into the third flow passage while the pusher is pressing the test carrier to the socket; and a sixth connection hole that connects to the test head and exhausts the fluid to the test head while the pusher is contacting the test head, the third flow passage connects to the fifth connection hole and the sixth connection hole, and the fluid supplied to the first flow passage is exhausted to the test head through the third flow passage.

16. The electronic component testing apparatus according to claim 15, wherein the pusher comprises:

a second connection pin that fits into a second fitting hole formed in a socket guide of the test head, the sixth connection hole and a part of the third flow passage are formed in the second connection pin.

* * * * *